(12) United States Patent
Sato et al.

(10) Patent No.: US 7,356,435 B2
(45) Date of Patent: Apr. 8, 2008

(54) SEMICONDUCTOR TEST APPARATUS AND CONTROL METHOD THEREFOR

(75) Inventors: Kazuhiko Sato, Tokyo (JP); Sae-Bum Myung, Tokyo (JP); Hiroyuki Chiba, Tokyo (JP)

(73) Assignee: Advantest Corporation, Tokyo (JP)

( * ) Notice: Subject to any disclaimer, the term of this patent is extended or adjusted under 35 U.S.C. 154(b) by 39 days.

(21) Appl. No.: 11/303,191

(22) Filed: Dec. 16, 2005

(65) Prior Publication Data
US 2006/0092755 A1    May 4, 2006

Related U.S. Application Data

(63) Continuation of application No. PCT/JP2004/08361, filed on Jun. 15, 2004.

(30) Foreign Application Priority Data

Jun. 19, 2003  (JP)  ............... 2003-174477
Jun. 27, 2003  (JP)  ............... 2003-185679

(51) Int. Cl.
*G06F 19/00*  (2006.01)

(52) U.S. Cl. ............... 702/118; 702/121; 702/189

(58) Field of Classification Search ................ 702/118, 702/121, 123, 189; 324/763, 537, 73.1, 723; 438/11, 14; 340/599; 714/718, 724, 746, 714/738, 742
See application file for complete search history.

(56) References Cited

U.S. PATENT DOCUMENTS

| | | | |
|---|---|---|---|
| 5,781,485 A * | 7/1998 | Lee et al. ............... 365/201 |
| 5,794,175 A | 8/1998 | Conner | |
| 6,021,515 A * | 2/2000 | Shimura ............... 714/738 |
| 6,499,121 B1 | 12/2002 | Roy et al. | |
| 6,518,073 B2 | 2/2003 | Momohara | |
| 6,617,842 B2 * | 9/2003 | Nishikawa et al. ...... 324/158.1 |
| 7,035,959 B2 * | 4/2006 | Umezu et al. ............. 710/315 |
| 2002/0049943 A1 | 4/2002 | Kobayashi | |
| 2004/0122620 A1 * | 6/2004 | Doi et al. ................. 702/182 |
| 2004/0177302 A1 * | 9/2004 | Mori et al. ................ 714/738 |

FOREIGN PATENT DOCUMENTS

JP   11-203893   7/1999

(Continued)

OTHER PUBLICATIONS

Lesmeister, 'The Linear Array Systolic Tester (LAST)', 1989, IEEE Publication, Paper 24.1, pp. 543-549.*

(Continued)

*Primary Examiner*—Edward Raymond
*Assistant Examiner*—Elias Desta
(74) *Attorney, Agent, or Firm*—Osha Liang LLP

(57) ABSTRACT

There is provided a semiconductor test apparatus including: a first waveform generating means that generates a common pattern waveform corresponding to common information common to each of a plurality of semiconductor devices; a plurality of second waveform generating means that generates individual pattern waveforms corresponding to a plurality of individual information individually prepared in response to each of the plurality of semiconductor devices; and a waveform switching unit that selectively performs an operation of inputting the common pattern waveform generated from the first waveform generating means in common and an operation of inputting the individual pattern waveforms respectively generated from the plurality of second waveform generating means individually, into each of the plurality of semiconductor devices.

12 Claims, 4 Drawing Sheets

FOREIGN PATENT DOCUMENTS

| | | |
|---|---|---|
| JP | 2002-15596 | 1/2002 |
| JP | 2002-71766 | 3/2002 |
| JP | 2002-174669 | 6/2002 |

OTHER PUBLICATIONS

Yeh et al., 'A Systematic Approach to Reduce Semiconductor Memory Test Time in Mass Production', 2005, IEEE Publication, pp. 1-6.*

Korean Office Action "Notice of Preliminary Rejection" issued in Korean Application No. 10-2005-7024360 mailed on Nov. 20, 2006 and English translation thereof, 5 pages.

International Search Report issued for International application No. PCT/JP2004/008361 mailed on Oct. 19, 2004, 2 pages.

Supplementary European Search Report for European Application No. 04745915.1-1233, dated Mar. 6, 2007 (3 pages).

* cited by examiner

SEMICONDUCTOR TEST APPARATUS AND CONTROL METHOD THEREFOR

CROSS REFERENCE TO THE RELATED APPLICATIONS

The present application is a continuation application of PCT/JP04/008361 filed on Jun. 15, 2004, which claims priority from Japanese Patent applications No. 2003-174477 filed on Jun. 19, 2003 and No. 2003-185679 filed on Jun. 27, 2003, the entire contents of which are incorporated herein by reference for all purposes.

BACKGROUND OF THE INVENTION

1. Field of the Invention

The present invention relates to a semiconductor test apparatus and a control method therefor. More particularly, the present invention relates to a semiconductor test apparatus testing a plurality of semiconductor devices at the same time and also to a control method therefor.

2. Description of Related Art

Conventionally, a semiconductor test apparatus has been known as an apparatus that variously tests a semiconductor device such as a logic IC or a semiconductor memory device before shipping. For example, a general semiconductor test apparatus that tests a semiconductor memory has a function simultaneously measuring plural devices. Thus, the general semiconductor test apparatus can input the same test data pattern waveform into the same pins of a plurality of semiconductor devices to perform a test. Since plural semiconductor memories can be measured by a small-scale resource, apparatus size does not become extremely large, thereby reducing a cost.

In case of a part of semiconductor memory devices, e.g., some flash memory, since defect area information identifying that a memory area is defective is written by a manufacturer on at least a part of the memory area (e.g., a block) including a defect cell detected by a test, this defect cell is masked. When defect area information is read from a memory area, equipment that uses the semiconductor memory device does not use the memory area.

When defect area information is written on a defect memory area of each semiconductor memory device after testing the plurality of semiconductor memory devices, since the defect area information should be input into each semiconductor memory device using an address and so on specifying a defect memory area as individual information, the defect area information cannot simultaneously be written on the plurality of semiconductor memory devices, similarly to the case of testing the above-described flash memory or the like. Thus, there has been a problem that a relief operation of writing defect area information requires time. Moreover, such a relief operation may conventionally be performed by means of a dedicated repair apparatus. However, since there is required a work for moving a semiconductor memory device, in which a defect cell is detected, from the semiconductor test apparatus to the repair apparatus, a relief operation requires longer time.

SUMMARY OF THE INVENTION

Therefore, it is an object of the present invention to provide a semiconductor test apparatus and a control method therefore that can solve the foregoing problems. The above and other objects can be achieved by combinations described in the appended claims.

According to the first aspect of the present invention, there is provided a semiconductor test apparatus. The semiconductor test apparatus includes: a first waveform generating means that generates a common pattern waveform corresponding to common information common to each of a plurality of semiconductor devices; a plurality of second waveform generating means that generates individual pattern waveforms corresponding to a plurality of individual information individually prepared in response to each of the plurality of semiconductor devices; and a waveform switching unit that selectively performs an operation of inputting the common pattern waveform generated from the first waveform generating means in common and an operation of inputting the individual pattern waveforms respectively generated from the plurality of second waveform generating means individually, into each of the plurality of semiconductor devices.

Each of the plurality of semiconductor devices may be a semiconductor memory device, and the waveform switching unit may selectively perform an operation of inputting the common pattern waveform generated from the first waveform generating means in common and an operation of individually inputting the individual pattern waveforms respectively generated from the plurality of second waveform generating means as write addresses to write data, into each of the plurality of semiconductor memory devices.

The semiconductor test apparatus may further include: a pass/fail deciding means that performs a pass/fail decision for spots under test in the semiconductor memory devices based on output waveforms output from the semiconductor memory devices in response to the common pattern waveform or the individual pattern waveforms; and a fail memory that stores a decision result by the pass/fail deciding means.

The semiconductor test apparatus may further include a memory that stores the individual information, and the second waveform generating means may read the individual information stored on the memory to generate the individual pattern waveform.

Each of the plurality of semiconductor memory devices may include an interface that inputs a write address and a write data by time-sharing, and the waveform switching unit: may individually input each of the plurality of individual pattern waveforms into each of the plurality of semiconductor memory devices via the interface at the timing at which the write address should be input into each of the plurality of semiconductor memory devices; and may in common input the common pattern waveform generated from the first waveform generating means into each of the plurality of semiconductor memory devices via the interface at the timing at which the write data should be input into each of the plurality of semiconductor memory devices.

The interface of each of the plurality of semiconductor memory devices may input a command, the write address, and the write data by time-sharing, and the waveform switching unit: may in common inputs the common pattern waveform generated from the first waveform generating means into each of the plurality of semiconductor memory devices via the interface at the timing at which the command should be input into each of the plurality of semiconductor memory devices; may individually input each of the plurality of individual pattern waveforms into each of the plurality of semiconductor memory devices via the interface at the timing at which the write address should be input into each of the plurality of semiconductor memory devices; and may in common input the common pattern waveform generated from the first waveform generating means into each of the plurality of semiconductor memory devices via the interface at the timing at which the write data should be input into each of the plurality of semiconductor memory devices.

The semiconductor test apparatus may further include: a plurality of pass/fail deciding means that performs a pass/fail decision for memory areas under test in the semiconductor memory devices based on an output waveform output from each of the plurality of semiconductor memory devices in response to the common pattern waveform generated from the first waveform generating means or the plurality of individual pattern waveforms generated from the plurality of second waveform generating means; a fail memory that stores a plurality of decision results by the plurality of pass/fail deciding means; and a defect memory area selecting means that outputs, as each of the plurality of individual information, information to identify a defect memory area about each of the plurality of semiconductor memory devices based on the plurality of decision results stored on the fail memory, each of the plurality of second waveform generating means may generate the individual pattern waveform indicative of an address of the defect memory area in each of the plurality of semiconductor memory devices, which is identified by each of the plurality of individual information, the first waveform generating means may generate a second common pattern waveform indicative of a write data to identify that a memory area is defective, and the waveform switching unit may individually input the individual pattern waveform into each of the plurality of semiconductor memory devices as the write address indicative of the defect memory area in the semiconductor memory device and in common inputs the second common pattern waveform as the write data showing that a memory area corresponding to the write address is defective, in order to write the write data on the write address.

The defect memory area selecting means may output information to identify one or a plurality of defect memory areas as each of the plurality of individual information about each of the plurality of semiconductor memory devices, each of the plurality of second waveform generating means may generate the individual pattern waveforms indicative of an address or addresses of one or the plurality of defect memory areas in each of the plurality of semiconductor memory devices, which is identified by each of the plurality of individual information, the first waveform generating means may generate the second common pattern waveform indicative of a write data to identify that a memory area is defective, and the waveform switching unit: may individually input the individual pattern waveforms into each of the plurality of semiconductor memory devices as one or the plurality of write addresses indicative of one or the plurality of defect memory areas in the semiconductor memory device; may in common input the second common pattern waveform as the write data showing that one or the plurality of memory areas corresponding to one or the plurality of write addresses is or are defective; and may write the write data of which writing has not been terminated into the semiconductor memory device (s), in which writing the write data into all defect memory areas has not been terminated, among the plurality of semiconductor memory devices in a state that writing into the semiconductor memory device, in which writing the write data into all defect memory areas has been terminated among the plurality of semiconductor memory devices, is prohibited.

According to the second aspect of the present invention, there is provided a method of controlling a semiconductor test apparatus that tests a plurality of semiconductor devices. The method includes: a first waveform generating step of generating a common pattern waveform corresponding to common information common to each of a plurality of semiconductor devices; a plurality of second waveform generating steps of generating individual pattern waveforms corresponding to a plurality of individual information individually prepared in response to each of the plurality of semiconductor devices; and a waveform switching step of selectively performing an operation of inputting the common pattern waveform generated in the first waveform generating step in common and an operation of inputting the individual pattern waveforms respectively generated in the plurality of second waveform generating steps individually, into each of the plurality of semiconductor devices.

According to the third aspect of the present invention, there is provided a semiconductor test apparatus that tests a plurality of semiconductor memory devices. The semiconductor test apparatus includes: a defect memory area selecting means that outputs individual information to identify a defect memory area about each of the plurality of semiconductor memory devices based on a test result of each of the plurality of semiconductor memory devices; and a waveform outputting means that in common inputs a pattern waveform corresponding to a command for write data in parallel with respect to the plurality of semiconductor memory devices, individually inputs a pattern waveform corresponding to an address of the defect memory area identified by the individual information of each of the plurality of semiconductor memory devices as a write address, and in common inputs a pattern waveform corresponding to data showing that a memory area corresponding to the write address is defective as a write data.

According to the fourth aspect of the present invention, there is provided a method of controlling a semiconductor test apparatus that tests a plurality of semiconductor memory devices. The method includes: a defect memory area selecting step of outputting individual information to identify a defect memory area about each of the plurality of semiconductor memory devices based on a test result of each of the plurality of semiconductor memory devices; and a waveform outputting step of in common inputting a pattern waveform corresponding to a command for write data in parallel with respect to the plurality of semiconductor memory devices, individually inputting a pattern waveform corresponding to an address of the defect memory area identified by the individual information of each of the plurality of semiconductor memory devices as a write address, and in common inputting a pattern waveform corresponding to data showing that a memory area corresponding to the write address is defective as a write data.

The summary of the invention does not necessarily describe all necessary features of the present invention. The present invention may also be a sub-combination of the features described above.

According to the present invention, it is possible to parallel perform an operation generating and inputting a plurality of individual information different from one another into each of a plurality of semiconductor devices and to shorten time required for a test and/or a relief operation when addresses based on separate individual information should be input into each of the plurality of semiconductor memory devices.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
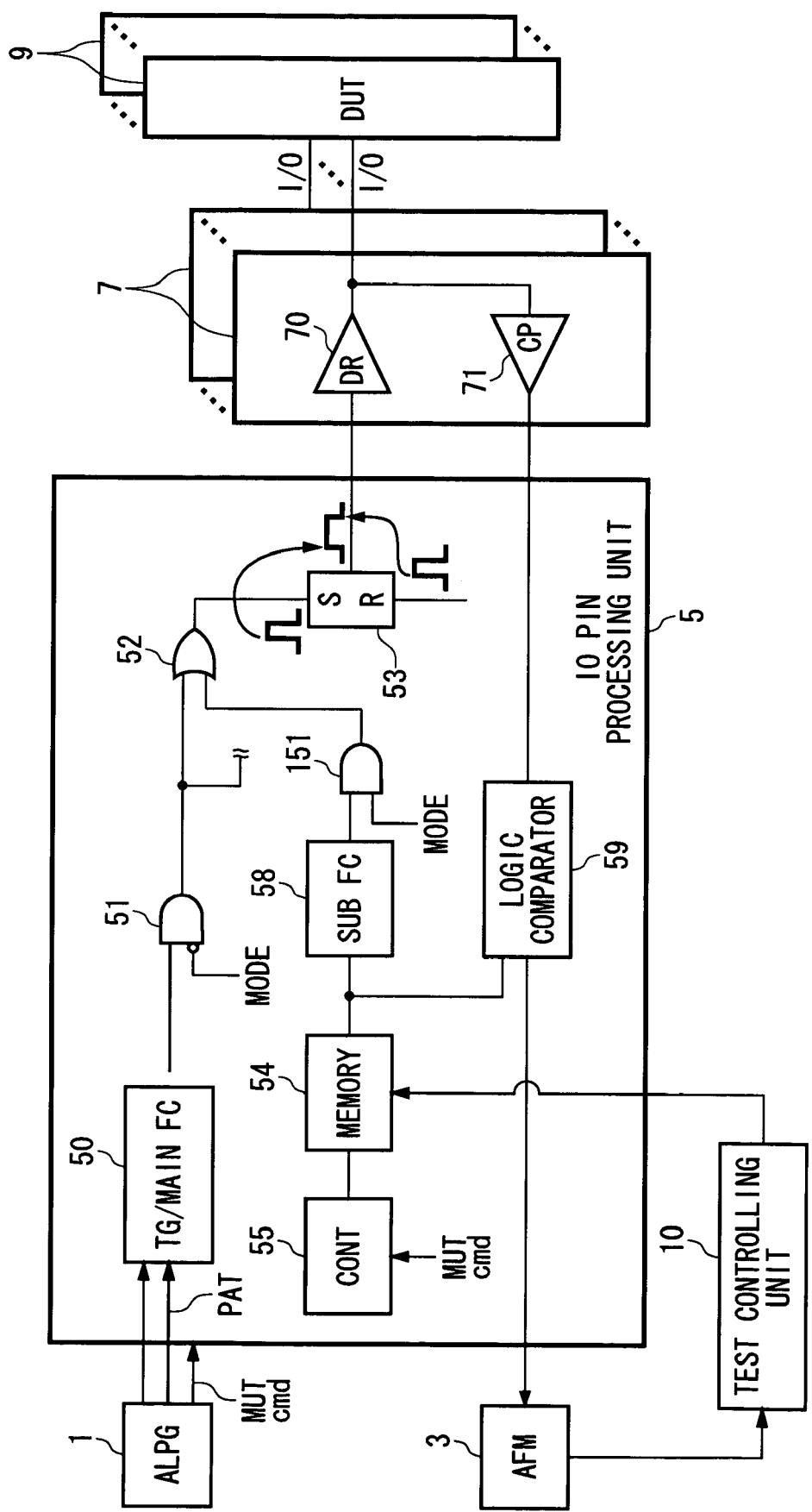
FIG. 1 is a view showing a configuration of a semiconductor test apparatus according to an embodiment.

FIG. 1 is a view showing a configuration of a semiconductor test apparatus according to the present embodiment. The semiconductor test apparatus shown in FIG. 1 performs a test for a plurality of DUTs (Device Under Test) 9 in parallel, and performs a relief operation for the plurality of DUTs 9 in parallel. For this purpose, the semiconductor test apparatus of the present embodiment includes an ALPG (algorithmic pattern generator) 1, an AFM (address fail memory) 3, an IO pin processing unit 5, an IO channel 7, and a test controlling unit 10. In addition, although the DUT 9 broadly include a semiconductor device such as a semiconductor memory device and a logic IC, the following will mainly be described about a semiconductor memory device as an object under test.

The ALPG 1 generates pattern data (PAT) to be input into IO pins of the DUT 9 in order to perform a test and a relief operation. The AFM 3 stores fail information that is a decision result provided by a test for the DUT 9 in a cell unit of the DUT 9. Specifically, a result testing pass/fail of a storage cell corresponding to logic addresses X and Y of either of the DUTs 9 is stored on an area specified by the addresses X and Y of the AFM 3.

The IO pin processing unit 5 includes a TG/main FC unit 50, a memory 54, a sub FC unit 58, and a logic comparator 59, in order to generate data to be input into IO pins of the DUT 9 and perform a pass/fail decision of data output from these IO pins. Here, the "IO pin" is a pin, which inputs and outputs a pattern waveform, such as a pin of a semiconductor memory device that inputs a command and/or an address into the semiconductor memory device and a pin that inputs and outputs data in a memory into and from the semiconductor memory device.

The TG/main FC unit 50 generates real data (a common pattern waveform) to be input into the DUT 9 based on a function as a timing generator that generates various timing edges included in a fundamental period of a test operation and this timing edge and pattern data output from the ALPG 1. The data are input into one input terminal of an AND circuit 51 provided in a subsequent stage. An individual writing mode signal (MODE) is input into the other input terminal of the AND circuit 51 in an inverted state. The "individual writing mode" is an operation mode to concurrently write individual information into each of the plurality of DUTs 9 that are objects for simultaneous measurement. The specification of individual writing mode signal is performed by setting this individual writing mode signal to a high level, e.g., by means of the above-described ALPG 1. Since this individual writing mode signal with a high level is input into the other input terminal of the AND circuit 51 in an inverted state, data output from the TG/main FC unit 50 is blocked in the AND circuit 51 when the individual writing mode is specified. In addition, this mode signal is a signal that can be controlled by the ALPG 1, and a common pattern waveform and individual writing pattern waveforms can be switched in real time by using this mode signal.

The memory 54 stores arbitrary pattern data. For example, the IO pin processing unit 5 is made up of an ASIC (Application Specific Integrated Circuit). Reading pattern data from the memory 54 is performed by control of an address pointer controller (CONT) 55.

The Sub FC unit 58 generates real data (an individual pattern waveform) to be input into each DUT 9 in the individual writing mode based on data to be input from the memory 54. The data output from the sub FC unit 58 is input into the other terminal of the AND circuit 151 of which one terminal is supplied with the individual writing mode signal (MODE), and is input into a subsequent OR circuit 52 when the individual writing mode signal is a high level.

In addition, the number of waveform information (including only waveform information necessary for multiple simultaneous measurement function) held in the sub FC unit 58 is set smaller than the number of waveform information held in the above-described TG/main FC unit 50. For this reason, the sub FC unit 58 is made up of a waveform shaper holding only minimum waveform information necessary for the individual writing mode. Moreover, it is assumed that each sub FC unit 58 individually has a function of a timing generator included in the TG/main FC unit 50.

The OR circuit 52 outputs data generated by the TG/main FC unit 50 and input via the AND circuit 51 or data generated by the sub FC unit 58 and input via the AND circuit 151. The output data of this OR circuit 52 is output to the IO channel 7 through a flip-flop 53 that generates a data pattern to be applied to the IO channel 7.

The logic comparator 59 compares data output from the IO pins of the DUT 9 and a predetermined expected value data, and performs a pass decision when these data are matched and performs a fail decision when these data are not matched. This decision result is stored on the AFM 3. In addition, in an internal configuration of the IO pin processing unit 5, the TG/main FC unit 50 and the AND circuit 51 are provided in common in response to the plurality of DUTs 9, and the sub FC unit 58, the memory 54, the logic comparator 59, and so on except for two are individually provided in response to each of the plurality of DUTs 9. Moreover, the IO pin processing unit 5 is individually provided in response to each of the plurality of IO pins in each DUT 9.

The IO channel 7 generates a real pattern waveform to be applied to the IO pins of the DUT 9, and converts the waveform really output from the IO pins into logical data. For this purpose, the IO channel 7 has a driver (DR) 70 and a comparator (CP) 71. The driver 70 generates a normal waveform based on data input into the flip-flop 53 in the corresponding IO pin processing unit 5. The comparator 71 determines a value of logical data by comparing a voltage of the waveform occurring in the IO pin (I/O) of the DUT 9 and a predetermined reference voltage.

The test controlling unit 10 is an example of a defect memory area selecting means, and is provided to control a test by the semiconductor test apparatus. Here, the test controlling unit 10 generates a plurality of individual information respectively used for a test operation or a relief operation of the plurality of DUTs 9 and outputs them to the memory 54, based on the decision result stored on the AFM 3. The test controlling unit 10 may perform a parallel process by means of one or a plurality of EWSs (engineering workstation) in order to speedup a process for generating individual information from the decision result.

In this manner, the ALPG 1, the AFM 3, and the IO pin processing unit 5 operate as a waveform outputting means that concurrently inputs a pattern waveform into the plurality of DUTs 9. Moreover, the TG/main FC unit 50 operates as a first waveform generating means that generates a common pattern waveform corresponding to common information common to each of the plurality of DUTs 9, which is supplied from the ALPG 1. The plurality of sub FC units 58 operates as a plurality of second waveform generating means that generates individual pattern waveforms corresponding to a plurality of individual information individually prepared in the memory 54 in response to each of the plurality of DUTs 9.

Moreover, the AND circuits 51 and 151 and the OR circuit 52 operate as a waveform switching unit that selectively performs an operation of inputting the common pattern waveform generated from the first waveform generating means in common and an operation of inputting the individual pattern waveforms respectively generated from the plurality of second waveform generating means individually, into each of the plurality of DUTs 9. Here, when writing defect area information into each defect area in the plurality of DUTs 9, the waveform switching unit may select and perform an operation individually inputting an individual pattern waveform into each of the plurality of DUTs 9. More specifically, the waveform switching unit may individually input an individual pattern waveform into each of the plurality of DUTs 9 as a write address on which data such as defect area information should be written.

Moreover, the logic comparator 59 operates as a pass/fail deciding means that performs a pass/fail decision for a spot under test in the DUT 9 based on the output waveform output from the DUT 9 in response to the common pattern waveform or the individual pattern waveforms. Then, the AFM 3 operates as a fail memory that stores a decision result by the pass/fail deciding means.

The semiconductor test apparatus according to the present embodiment has such a configuration. Hereinafter, it will be described about a test operation and a relief operation for the DUT 9.

(1) Test Operation (1-1) When Writing the Same Data into the Plurality of DUTs 9

The pattern data output from the ALPG 1 is supplied to the IO pin processing unit 5 corresponding to an IO pin that is an input object of this pattern data. In the IO pin processing unit 5, the TG/main FC unit 50 creates test data tailored to real input timing based on the input pattern data. At this time, since an individual writing mode signal is held at a low level, the output data of the TG/main FC unit 50 input into one input terminal is output from the AND circuit 51 at it is. The output terminal of this AND circuit 51 is divergingly connected to one input terminal of the OR circuit 52 provided in response to each of the plurality of DUTs 9. Therefore, the common data output from the TG/main FC unit 50 is simultaneously input into the plurality of OR circuits 52, and is input into the flip-flop 53.

In the IO channel 7, the driver 70 generates a normal waveform based on data input into the flip-flop 53 in the IO pin processing unit 5. This normal waveform is input into the corresponding IO pin (I/O).

In this way, a normal waveform generated by the IO pin processing unit 5 and the IO channel 7 is input into the IO pin. In the IO channel 7 corresponding to this IO pin, the comparator 71 compares a voltage of a waveform output from this IO pin and a predetermined reference voltage to generate logical data. Furthermore, in the IO pin processing unit 5 corresponding to this IO pin, the logic comparator 59 performs a pass/fail decision with the use of data input from the comparator 71 in the IO channel 7. This decision result is stored on the AFM 3.

(1-2) When Writing Individual Information into Each of the Plurality of DUTs 9

When an individual writing mode is specified and an individual writing mode signal (MODE) is output, the AND circuit 51 masks the output data of the TG/main FC unit 50 and instead starts an individual writing operation using an individual pattern stored on the memory 54.

According to the individual writing operation using the memory 54, the pattern data corresponding to each IO pin of each DUT 9 stored on the memory 54 is read and is input into the sub FC unit 58. The sub FC unit 58 creates test data corresponding to individual information for each DUT 9 tailored to real input timing based on the input pattern data. Then, a normal waveform is generated based on data input into the flip-flop 53 via the OR circuit 52. In the IO channel 7, the driver 70 generates a normal waveform based on data input into the flip-flop 53 in the IO pin processing unit 5. According to the individual writing mode, a normal waveform different from one another is generated every DUT 9, and is input into the IO pin (IO) of the corresponding DUT 9.

Figure 2:
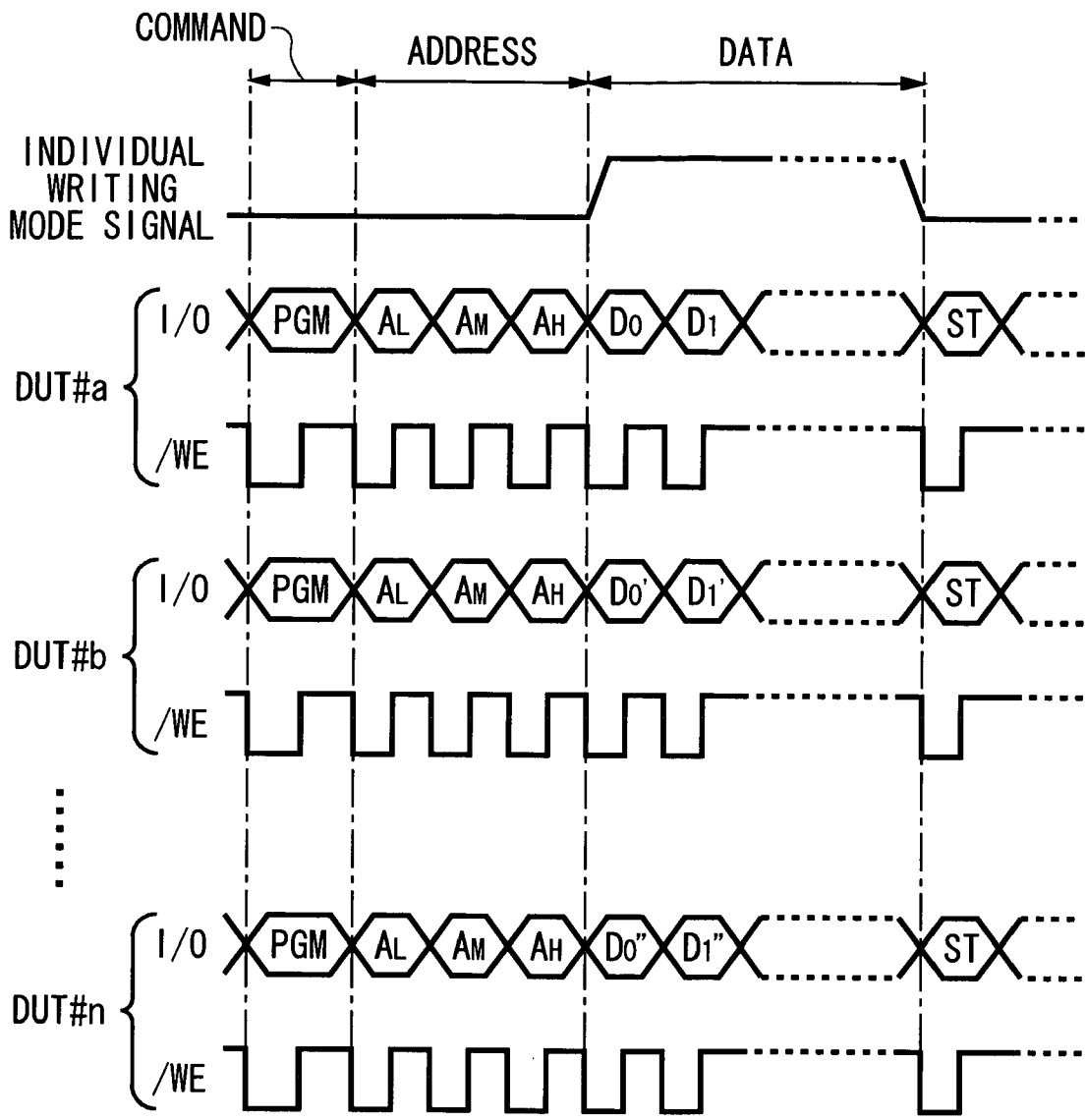
FIG. 2 is a view showing an operative example of a test in which an individual writing operation is performed if required.

FIG. 2 is a timing diagram showing an operative example of a test in which an individual writing operation is performed if required, and shows an example of the timing when a plurality of flash memories is tested as the plurality of DUTs 9. In this example, the IO pin (IO) of each of the plurality of DUTs 9 includes an interface for inputting a command, a write address, and a write data during a writing operation by time-sharing.

As shown in FIG. 2, when a flash memory is tested, at first common data (a program) corresponding to "a command" are input into the IO pin (IO). This input operation is performed by generating common data by means of the TG/main FC unit 50 in the IO pin processing unit 5 based on the pattern data stored on the ALPG 1.

Next, it is necessary to input data as individual information into a specific address appointed by ($A_L$, $A_M$, $A_H$). These data are set to contents different from one another for each flash memory. For example, data $D_0$, $D_1$, ... are set in response to DUT#a, data $D_0'$, $D_1'$, ... are set in response to DUT#b, ... and data $D_0''$, $D_1''$, ... are set in response to DUT#n. Specifically, the input operation for the specific address ($A_L$, $A_M$, $A_H$) is performed by generating common data by means of the TG/main FC unit 50 in the IO pin processing unit 5 based on the pattern data stored on the ALPG 1. Moreover, an input operation of individual information such as data $D_0$, $D_0'$, $D_0''$ is performed by generating individual data by means of the sub FC unit 58 in the IO pin processing unit 5 based on individual information stored on the AFM 3 or the memory 54.

In other words, when performing a test of writing different write data at the same write address of each of the plurality of DUTs 9, the waveform switching unit in common inputs the common pattern waveform generated from the first waveform generating means into each of the plurality of DUTs 9 via the interface of each of the DUTs 9 at the timing at which the command and the common write address should be input into each of the plurality of DUTs 9. Moreover, the waveform switching unit individually inputs each of the plurality of individual pattern waveforms generated from the second waveform generating means into each of the plurality of DUTs 9 via the interface of each of the DUTs 9 at the timing at which the different write data should be input into each of the plurality of DUTs 9.

In this way, a program is executed in each of the DUTs 9 (DUT#a . . . DUT#n) when the common command and address and individual data are input. Then, a command instructing an output of a programming result is input into each of the plurality of DUTs 9 through the IO pin based on the pattern data stored on the ALPG 1, and thus the programming result is output in a polling format. This programming result is input into the comparator 71 in the IO channel 7, and further a pass/fail decision is performed in the logic comparator 59 in the IO pin processing unit 5.

In the above-described process, the semiconductor test apparatus can change a test operation using the ALPG 1 into a test operation of an individual writing mode using the memory 54 at any timing by switching an individual writing mode signal from a low level to a high level in the middle of the test. Moreover, if required after that, the test operation can be returned to a test operation using the ALPG 1 by returning the individual writing mode signal from a high level to a low level. More particularly, when the contents of the individual writing mode signal and the switching timing are specified by the pattern data generated by the ALPG 1, the mode can be switched between the individual writing mode and the normal mode at the necessary timing in a series of test operations, and thus complicated control for the timing becomes unnecessary. By such a control, the semiconductor test apparatus can supply a common command, address, and data in relation to at least a part of a command, an address, and data to be supplied to the plurality of DUTs 9, and supply an individual command, address, and data in relation to the other part.

(2) Relief Operation

In a relief operation, it is necessary to input an address to specify a defect memory area of each of the plurality of DUTs 9 into each of the DUTs 9 as individual information and to input defect area information in common as a write data. In other words, an operation of inputting individual information into a specific IO pin is equal to an operation of the individual writing mode in the above-described test operation. Moreover, an operation of inputting common information into the IO pin of each of the DUTs 9 is equal to an operation other than the individual writing mode in the above-described test operation.

Therefore, the setting of each unit of the IO pin processing unit 5 during a relief operation is basically equal to the setting of these units during the individual writing mode in the above-described test operation. The individual write address indicative of a relief point of each DUT 9 is generated by the sub FC unit 58 in the IO pin processing unit 5, and is input from the IO channel 7 to the IO pin of each DUT 9.

Figure 3:
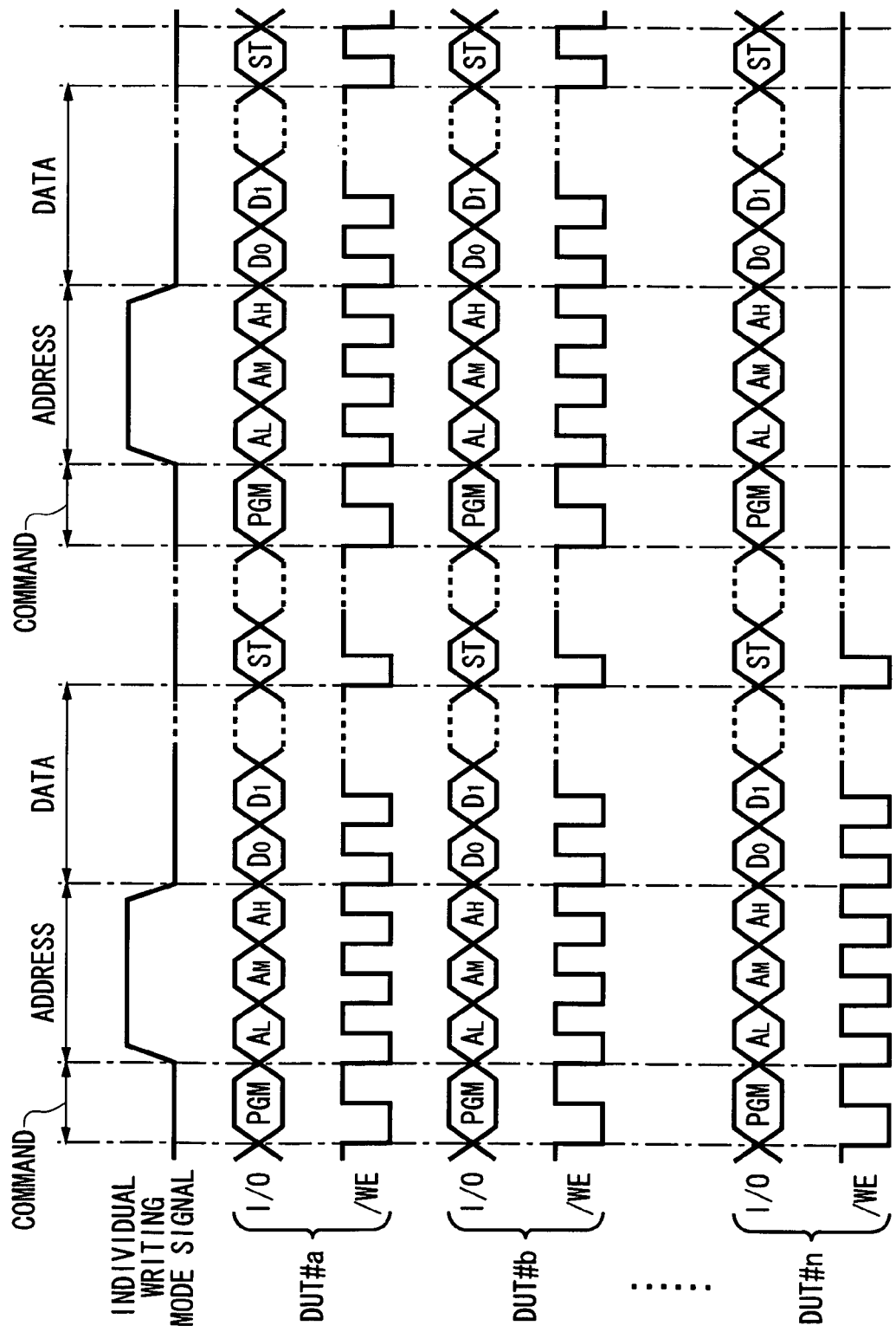
FIG. 3 is a view showing an operative example of a relief operation in which an individual writing operation is performed if required.

FIG. 3 is a timing diagram showing an operative example of a relief operation. When the DUT 9 including a defect cell is relieved, the semiconductor test apparatus firstly performs a test operation, and writes individual information identifying a defect memory area into the memory 54 based on the decision result stored on the AFM 3 as a result of the test.

More specifically, the plurality of logic comparators 59 performs a pass/fail decision of a memory area of an object under test in the DUT 9 based on the first common pattern waveform generated by the first waveform generating means or the output waveform output from each of the plurality of DUTs 9 in response to the plurality of individual pattern waveforms generated by the plurality of second waveform generating means. Next, the AFM 3 stores each of the decision results by the plurality of logic comparators 59 as the test result of each of the plurality of DUTs 9. Then, the test controlling unit 10 outputs information identifying a defect memory area about each of the plurality of DUTs 9 to each of the plurality of memories 54 as each of the plurality of individual information based on the plurality of decision results stored on the AFM 3, and stores the information on the memories.

The first waveform generating means generates a common pattern waveform of common data (a program) corresponding to "a command". The waveform switching unit in common inputs the common pattern waveform corresponding to the command into each of the plurality of DUTs 9 via the interface of the IO pin at the timing at which the command should be input into each of the plurality of DUTs 9.

Next, each of the plurality of second waveform generating means generates individual pattern waveform indicative of an address of a defect memory area in each of the plurality of DUTs 9, which is identified by each of the plurality of individual information respectively corresponding to the plurality of DUTs 9, stored on the memory 54. The waveform switching unit individually inputs each of the plurality of individual pattern waveforms into each of the plurality of DUTs 9 via the interface of the IO pin at the timing at which a write address should be input into each of the plurality of DUTs 9.

Next, the first waveform generating means generates a common pattern waveform indicative of a write data identifying that a memory area is defective. The waveform switching unit in common inputs the common pattern waveform generated by the first waveform generating means into each of the plurality of DUTs 9 via the interface of the IO pin at the timing at which write data should be input into each of the plurality of DUTs 9.

By the above-described process, the waveform outputting means can in common input a pattern waveform corresponding to a command to write data, individually input a pattern waveform corresponding to an address of a defect memory area identified by individual information on each of the plurality of DUTs 9 as a write address, and in common input a pattern waveform corresponding to data showing that the memory area corresponding to the write address is defective as write data, into the plurality of DUTs 9 in parallel. More specifically, the waveform switching unit can individually input an individual pattern waveform as a write address indicative of the defect memory area of the DUT 9 and in common input a common pattern waveform as write data showing that the memory area corresponding to the write address is defective, into each of the plurality of DUTs 9, in order to write the write data on the write address. As a result, the semiconductor test apparatus can write defect area information into defect memory areas having different addresses of the plurality of DUTs 9 in parallel, and thus time required for a relief operation can be shortened.

Here, when each of the plurality of DUTs 9 has one or a plurality of defect memory areas, the semiconductor test apparatus performs a relief operation described below. The test controlling unit 10 outputs information to identify one or a plurality of defect memory areas about each of the plurality of DUTs 9 as each of the plurality of individual information and stores the information on each of the plurality of memories 54, based on the plurality of decision results stored on the AFM 3.

The first waveform generating means generates a common pattern waveform of common data (a program) corresponding to "a command" in response to one or a plurality of defect memory areas in the plurality of DUTs 9. Each of the plurality of second waveform generating means sequentially generates an individual pattern waveform indicative of an address or addresses of one or a plurality of defect memory areas in each of the plurality of DUTs 9, which is identified by each of the plurality of individual information stored on the memory 54. Moreover, the first waveform generating means generates a common pattern waveform indicative of write data identifying that a memory area is defective, in response to each of one or the plurality of defect memory areas.

The waveform switching unit in common inputs the common pattern waveform of the command into each of the plurality of DUTs 9 in response to each of the defect memory areas of the DUT 9. Moreover, the waveform switching unit individually inputs the individual pattern waveform into each of the plurality of DUTs 9 as one or a plurality of write addresses indicative of one or the plurality of defect memory areas of the DUT 9. Moreover, the waveform switching unit in common inputs a common pattern waveform of the generated write data as write data showing that one or the plurality of memory areas corresponding to one or the plurality of write addresses is defective.

In the above-described process, the plurality of DUTs 9 may respectively have a defect memory area having the number different from one another. In this case, for example, as shown in the second writing of DUT#n in FIG. 3, the waveform switching unit writes the write data of which writing has not been terminated in DUT 9, in which writing the write data into all defect memory areas has not been terminated, among the plurality of DUTs 9, in a state that writing in the DUT 9, in which writing the write data into all defect memory areas has been terminated among the plurality of DUTs 9, is prohibited.

More specifically, the waveform switching unit writes the write data by enabling a write enable signal pin (/WE) of the DUT 9 in relation to each DUT 9 in which writing the write data into all defect memory areas has not been terminated, based on the individual information stored on the memory 54. On the other hand, the waveform switching unit prohibits writing the write data by disabling the write enable signal pin (/WE) of the DUT 9 in relation to each DUT 9 in which writing the write data into all defect memory areas has been terminated.

Here, the waveform switching unit may select or unselect the DUT 9 to permit or prohibit writing the write data by enabling or disabling a chip enable signal pin (/CE) in place of the write enable signal pin.

In this manner, according to the semiconductor test apparatus of the present embodiment, since an operation of generating and inputting a plurality of individual information different from one another with respect to each of the plurality of DUTs 9 can be performed concurrently, it is possible to shorten time required for a test when the input of separate individual information is required.

Moreover, it is possible to control enlargement of an apparatus scale in minimum by setting the type of waveform capable of being selected in the sub FC unit 58 smaller than the type of waveform capable of being selected in the TG/main FC unit 50.

Moreover, since the memory 54 storing individual information is included in the IO pin processing unit 5, it is not necessary to have electric wiring disposed on the outside of a package of ASIC, and thus simplification of electric wiring is enabled. Moreover, since unnecessary wiring disappears, misalignment of timing is reduced, and thus it is possible to perform reading of individual information at high speed.

Moreover, the above-described embodiment uses the sub FC unit 58, in which a part of these functions has been omitted, separately from the TG/main FC unit 50. However, when enlargement of an apparatus scale is permitted, the same TG/main FC unit may be used instead of the sub FC unit 58.

Figure 4:
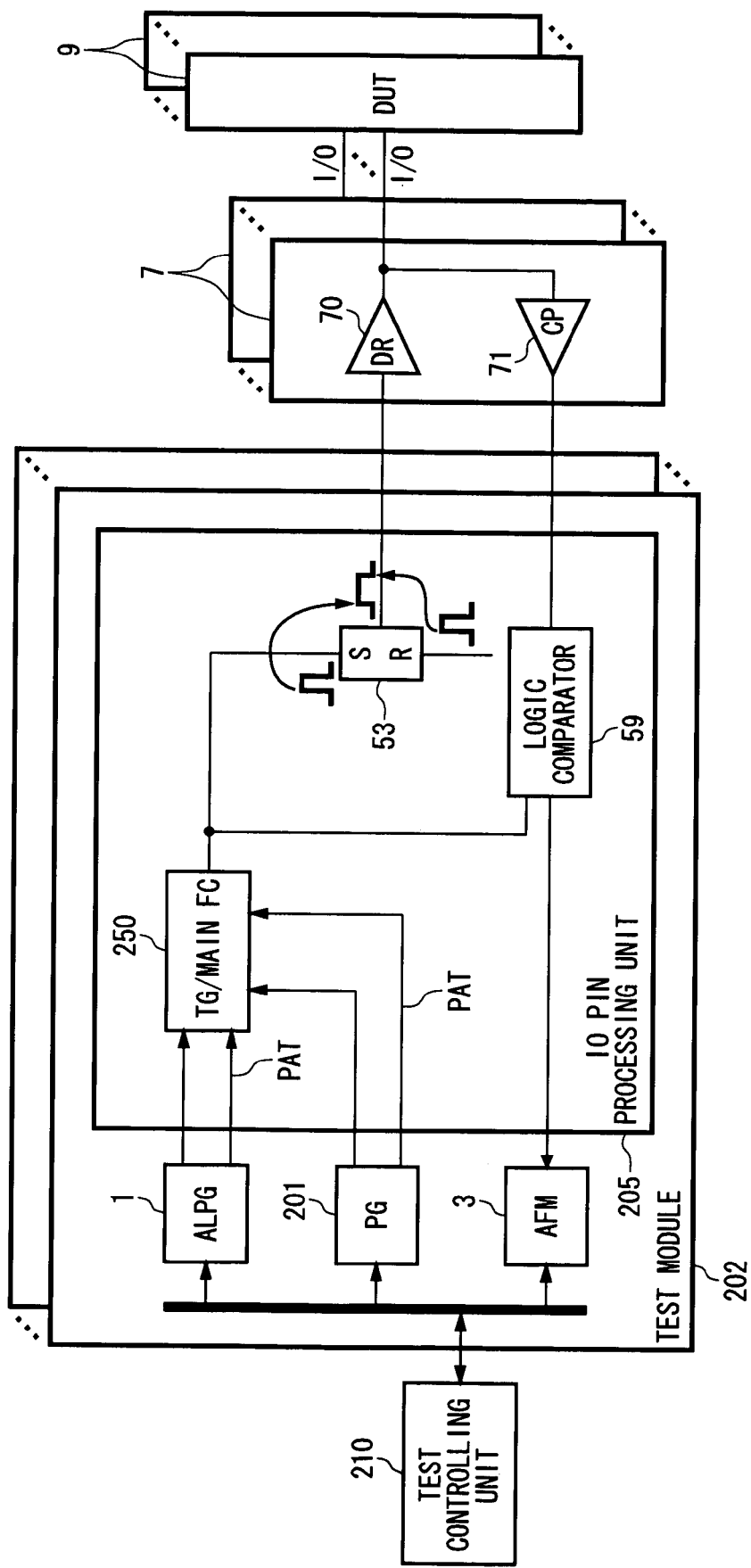
FIG. 4 is a view showing a configuration of a semiconductor test apparatus according to an alternative example of the present embodiment.

FIG. 4 is a view showing a configuration of a semiconductor test apparatus according to an alternative example of the present embodiment. The semiconductor test apparatus shown in FIG. 4 performs a test for the plurality of DUTs 9 in parallel, and performs a relief operation for the plurality of DUTs 9 in parallel. Here, since the components of FIG. 4 having the same reference numbers as those of FIG. 1 have the same or similar functions as or to those of FIG. 1, their descriptions will be omitted.

The semiconductor test apparatus according to this alternative example includes a plurality of test modules 202 provided in response to each of the plurality of DUTs 9, an IO channel 7, and a test controlling unit 210.

The plurality of test modules 202 is an example of the waveform outputting means, and inputs pattern data generated from the ALPG 1 or a PG (a pattern generator) 201 into the plurality of DUTs 9 via the IO channel 7 in parallel. The test module 202 has the ALPG 1, the PG 201, one or the plurality of IO pin processing units 205, and the AFM 3. The PG 201 includes a pattern memory storing a test pattern to be output into the DUT 9, and sequentially supplies the test pattern stored on the pattern memory to the IO pin processing unit 205.

The IO pin processing units 205 are plurally provided in response to each of the plurality of IO pins of the DUT 9 to which the test module 202 is connected, and generate data to be input into the DUT 9 based on pattern data supplied from the ALPG 1 or PG 201 and perform a pass/fail decision of data output from the corresponding IO pin. The IO pin processing unit 205 includes a TG/main FC unit 250, a flip-flop 53, and a logic comparator 59. The TG/main FC unit 250 generates a pattern waveform to be input into the DUT 9 to which the test module 202 including the TG/main FC unit 250 is connected, and supplies the pattern waveform to the flip-flop 53. Since the TG/main FC unit 250 has the same function and configuration as those of the TG/main FC unit 50 shown in FIG. 1, its description will be omitted except for the following difference.

The test controlling unit 210 is an example of a defect memory area selecting means, and is provided to control a test by the semiconductor test apparatus. Here, the test controlling unit 210 generates a plurality of individual information respectively used for a test operation or a relief operation of the plurality of DUTs 9 and outputs them to the test controlling unit 210, based on the decision result stored on the AFM 3 as each test result of the plurality of DUTs 9.

It will below be described about a test operation and a relief operation of the DUT 9 by the semiconductor test apparatus according to the present alternative example.

(1) Test Operation (1-1) When Writing the Same Data into the Plurality of DUTs 9

The plurality of ALPGs 1 respectively provided in response to the plurality of DUTs 9 generates the same pattern data based on the same algorithm. The pattern data output from the ALPG 1 is supplied to the IO pin processing unit 205 corresponding to the IO pin that is an input object for this pattern data. In the IO pin processing unit 205, the TG/main FC unit 50 creates test data tailored to real input timing based on the input pattern data. In the IO channel 7, the driver 70 generates a normal waveform based on data input into the flip-flop 53 in the IO pin processing unit 205. This normal waveform is input into the corresponding IO pin (I/O).

In this way, the normal waveform generated by the IO pin processing unit 205 and the IO channel 7 is input into the IO pin. In the IO channel 7 corresponding to this IO pin, the comparator 71 compares a voltage of a waveform output from this IO pin and a predetermined reference voltage to generate logical data. Furthermore, in the IO pin processing unit 5 corresponding to this IO pin, the logic comparator 59 performs a pass/fail decision with the use of data input from the comparator 71 in the IO channel 7. The decision result is stored on the AFM 3.

(1-2) When Writing Individual Information into Each of the Plurality of DUTs 9

When writing individual information into each of the plurality of DUTs 9 in parallel, the test controlling unit 210 stores test patterns different from one another in response to individual information on the pattern memories provided in the PGs 201 in the plurality of test modules 202. The PG 201 reads individual test pattern to supply individual pattern data to the TG/main FC unit 250. The TG/main FC unit 250 creates test data corresponding to individual information for each DUT 9 tailored to real input timing based on the input pattern data. The flip-flop 53 generates a normal waveform based on the input data. In the IO channel 7, the driver 70 generates a normal waveform based on the data input into the flip-flop 53 in the IO pin processing unit 205. In an individual writing mode, normal waveforms different from one another for each DUT 9 are generated, and are respectively input into the IO pin (IO) of the corresponding DUT 9.

In the semiconductor test apparatus according to the present alternative example, the timing of the test operation, at which an individual writing operation is performed, is similar to the timing of the test operation, e.g., when the individual writing mode signal in FIG. 2 is excluded. In the present alternative example, test patterns sequentially outputting common pattern data corresponding to "a command", common pattern data corresponding to "an address", and individual pattern data corresponding to "data" are stored on the plurality of PGs 201 respectively corresponding to the plurality of DUTs 9.

The plurality of test modules 202 writes data different from one another into the plurality of DUTs 9 in parallel based on the test pattern stored on the PG 201 in the test module 202. More specifically, the IO pin processing unit 205 in common inputs pattern waveforms corresponding to a writing command and a write address stored on all the PGs 201 in common into the DUT 9 and in common inputs pattern waveforms corresponding to write data individually stored on each PG 201 into the DUT 9, in order to concurrently write the write data different from one another on the same write address of each of the plurality of DUTs 9. In this way, the semiconductor test apparatus according to the present alternative example can supply a command, an address, and/or data to be supplied to the plurality of DUTs 9 and supply individual commands, addresses, and/or data to the other units.

(2) Relief Operation

In a relief operation, it is necessary to input an address to specify a defect memory area of each of the plurality of DUTs 9 into each of the DUTs 9 as individual information and to input defect area information as write data in common. In other words, an operation of inputting individual information into the specific IO pin is equal to an individual writing operation in the above-described test operation. Moreover, an operation of inputting common information into the IO pin of each of the DUTs 9 is equal to operations other than the individual writing operation in the above-described test operation.

Therefore, the setting of each unit in the IO pin processing unit 205 during a relief operation is basically equal to the setting in the individual writing operation in the above-described test operation. In other words, an individual write address indicative of a relief point of each DUT 9 is stored as the test pattern in the PG 201 corresponding to the DUT 9, and a pattern waveform is generated by the TG/main FC unit 250 in the IO pin processing unit 205 to be input from the IO channel 7 into the IO pin of each DUT 9.

In the semiconductor test apparatus according to the present alternative example, the timing of the test operation, at which an individual relief operation is performed, is similar to the timing of the test operation, e.g., when the individual writing mode signal in FIG. 3 is excluded.

More specifically, the test controlling unit 210 generates test patterns including individual information identifying a defect area for each of the plurality of DUTs 9 based on the plurality of decision results stored on the AFM 3 that is a test result of each of the plurality of DUTs 9. The test patterns are test patterns for sequentially outputting common pattern data corresponding to "a command", individual pattern data corresponding to "an address", and common pattern data corresponding to "data". The test controlling unit 210 individually transmits test patterns generated in response to each DUT 9 to each of the plurality of test modules 202, and stores them on the PG 201.

The plurality of test modules 202 writes defect area information into defect memory areas different from one another of the plurality of DUTs 9 in parallel, based on the test pattern stored on the PG 201 in the test module 202. More specifically, based on the test pattern stored on the PG 201, the IO pin processing unit 205 in common inputs a pattern waveform corresponding to a writing command into the plurality of DUTs 9, individually inputs a pattern waveform corresponding to an address of a defect memory area, which is identified by individual information of each of the plurality of DUTs 9, into the plurality of DUTs 9 as a write address, and in common inputs a pattern waveform corresponding to data showing that the memory area corresponding to the write address is defective into the plurality of DUTs 9 as write data. In this way, the semiconductor test apparatus according to the present alternative example can concurrently write the write data different from one another on the same write address of each of the plurality of DUTs 9. As a result, the semiconductor test apparatus according to the present alternative example can concurrently write defect area information into defect memory areas having different addresses of the plurality of DUTs 9, and thus can shorten time required for a relief operation.

In addition, the present invention is not limited to the above-described embodiments, but can have various kinds of alternative embodiments in a range of subject matter of the present invention. For example, in the embodiments, although a semiconductor memory is mainly used as the DUT 9, a logic IC can also be used as the DUT 9 when a plurality of logic ICs is tested at the same time.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

INDUSTRIAL APPLICABILITY

As apparent from the above descriptions, according to the present invention, it is possible to parallel perform an operation generating and inputting a plurality of individual information different from one another into each of a plurality of semiconductor devices and to shorten time required for a test and/or a relief operation when addresses based on separate individual information should be input into each of the plurality of semiconductor memory devices.

What is claimed is:

1. A semiconductor test apparatus, comprising:
   a first waveform generating means that generates a common pattern waveform corresponding to common information common to each of a plurality of semiconductor devices;
   a plurality of second waveform generating means that generates individual pattern waveforms indicative of an address of the defect memory area in each of the plurality of semiconductor memory devices, which is identified by each of the plurality of individual information in response to each of the plurality of semiconductor devices; and
   a waveform switching unit that selectively performs an operation of inputting the common pattern waveform generated from said first waveform generating means in common and an operation of inputting the individual pattern waveforms respectively generated from said plurality of second waveform generating means individually, as write addresses to write data into each of the plurality of semiconductor devices; and
   a test controlling unit configured to output information relating to the common pattern waveform and the individual pattern waveforms,
   wherein said first waveform generating means generates common writing data to identify a defect memory area of the semiconductor memory devices, and said waveform switching unit individually inputs the individual pattern waveform into each of the plurality of semiconductor memory devices, and in common inputs the writing data in order to write the writing data on the writing address.

2. The semiconductor test apparatus as claimed in claim 1,
   wherein each of the plurality of semiconductor devices is a semiconductor memory device, and
   said waveform switching unit selectively performs an operation of inputting the common pattern waveform generated from said first waveform generating means in common and an operation of individually inputting the individual pattern waveforms respectively generated from said plurality of second waveform generating means as write addresses to write data, into each of the plurality of semiconductor memory devices.

3. The semiconductor test apparatus as claimed in claim 2, wherein the semiconductor test apparatus further comprises:
   a plurality of pass/fail deciding means that performs a pass/fail decision for memory areas under test in the semiconductor memory devices based on an output waveform output from each of the plurality of semiconductor memory devices in response to the common pattern waveform generated from said first waveform generating means or the plurality of individual pattern waveforms generated from said plurality of second waveform generating means;
   a fail memory that stores a plurality of decision results by said plurality of pass/fail deciding means; and
   wherein the test controlling unit outputs, as each of the plurality of individual information, information to identify a defect memory area about each of the plurality of semiconductor memory devices based on the plurality of decision results stored on said fail memory,
   each of said plurality of second waveform generating means generates the individual pattern waveform indicative of an address of the defect memory area in each of the plurality of semiconductor memory devices, which is identified by each of the plurality of individual information,
   said first waveform generating means generates a second common pattern waveform indicative of a write data to identify that a memory area is defective, and said waveform switching unit individually inputs the individual pattern waveform into each of the plurality of semiconductor memory devices as the write address indicative of the defect memory area in the semiconductor memory device and in common inputs the second common pattern waveform as the write data showing that a memory area corresponding to the write address is defective, in order to write the write data on the write address.

4. The semiconductor test apparatus as claimed in claim 3,
   wherein said defect memory area selecting means outputs information to identify one or a plurality of defect memory areas as each of the plurality of individual information about each of the plurality of semiconductor memory devices,
   each of said plurality of second waveform generating means generates the individual pattern waveforms indicative of an address or addresses of one or the plurality of defect memory areas in each of the plurality of semiconductor memory devices, which is identified by each of the plurality of individual information,
   said first waveform generating means generates the second common pattern waveform indicative of a write data to identify that a memory area is defective, and
   said waveform switching unit:
     individually inputs the individual pattern waveforms into each of the plurality of semiconductor memory devices as one or the plurality of write addresses indicative of one or the plurality of defect memory areas in the semiconductor memory device;
     in common inputs the second common pattern waveform as the write data showing that one or the plurality of memory areas corresponding to one or the plurality of write addresses is or are defective; and
     writes the write data of which writing has not been terminated into the semiconductor memory device(s), in which writing the write data into all defect memory areas has not been terminated, among the plurality of semiconductor memory devices in a state that writing into the semiconductor memory device, in which writing the write data into all defect memory areas has been terminated among the plurality of semiconductor memory devices, is prohibited.

5. A method of controlling a semiconductor test apparatus that tests a plurality of semiconductor devices, comprising:

a first waveform generating step of generating common writing data to identify a defect memory area of the semiconductor memory devices;

a plurality of second waveform generating steps of generating individual pattern waveforms indicative of an address of the defect memory area in each of the plurality of semiconductor memory devices, which is identified by each of the plurality of individual information in response to each of the plurality of semiconductor devices; and a waveform switching step of selectively performing an operation of inputting the common pattern waveform generated in said first waveform generating step in common and an operation of inputting the individual pattern waveforms respectively generated in said plurality of second waveform generating steps individually, into each of the plurality of semiconductor devices; and a test controlling unit step outputting information relating to the common pattern waveform and the individual pattern waveforms, wherein said wave form switching step including steps of individually inputting the individual pattern waveform, as write addresses to write data, into each of the plurality of semiconductor devices, and in common inputting the writing data in the plurality of semiconductor devices in order to write the writing data on the writing address.

6. A semiconductor test apparatus that tests a plurality of semiconductor memory devices, comprising:

a defect memory area selecting means that outputs individual information to identify a defect memory area about each of the plurality of semiconductor memory devices based on a test result of each of the plurality of semiconductor memory devices; and a waveform outputting means that in common inputs a pattern waveform corresponding to a command for write data in parallel with respect to the plurality of semiconductor memory devices, individually inputs a pattern waveform corresponding to an address of the defect memory area identified by the individual information of each of the plurality of semiconductor memory devices as a write address, and in common inputs a pattern waveform corresponding to data showing that a memory area corresponding to the write address is defective as a write data.

7. A method of controlling a semiconductor test apparatus that tests a plurality of semiconductor memory devices, comprising:

a defect memory area selecting step of outputting individual information to identify a defect memory area about each of the plurality of semiconductor memory devices based on a test result of each of the plurality of semiconductor memory devices; and a waveform outputting step of in common inputting a pattern waveform corresponding to a command for write data in parallel with respect to the plurality of semiconductor memory devices, individually inputting a pattern waveform corresponding to an address of the defect memory area identified by the individual information of each of the plurality of semiconductor memory devices as a write address, and in common inputting a pattern waveform corresponding to data showing that a memory area corresponding to the write address is defective as a write data.

8. A semiconductor test apparatus, comprising:

a first waveform generating means that generates a common pattern waveform corresponding to common information common to each of a plurality of semiconductor devices;

a plurality of second waveform generating means that generates individual pattern waveforms corresponding to a plurality of individual information individually prepared in response to each of the plurality of semiconductor devices; and a waveform switching unit that selectively performs an operation of inputting the common pattern waveform generated from said first waveform generating means in common and an operation of inputting the individual pattern waveforms respectively generated from said plurality of second waveform generating means individually, into each of the plurality of semiconductor devices; and a test controlling unit configured to output information relating to the common pattern waveform and the individual pattern waveforms, wherein each of the plurality of semiconductor memory devices comprises an interface that inputs a writing address and a writing data by time-sharing, and said waveform switching unit selectively performs an operation of inputting the common pattern waveform generated from said first waveform generating means in common and an operation of individually inputting the individual pattern waveforms respectively generated from said plurality of second waveform generating means into each of the plurality of semiconductor memory devices at the timing at which the writing address should be input into each of the plurality of semiconductor memory devices and at the timing at which the writing data should be input into each of the plurality of semiconductor memory devices.

9. The semiconductor test apparatus as claimed in claim 8, further comprising:

a pass/fail deciding means that performs a pass/fail decision for spots under test in the semiconductor memory devices based on output waveforms output from the semiconductor memory devices in response to the common pattern waveform or the individual pattern waveforms; and a fail memory that stores a decision result by said pass/fail deciding means.

10. The semiconductor test apparatus as claimed in claim 8, wherein the semiconductor test apparatus further comprises a memory that stores the individual information, and said second waveform generating means reads the individual information stored on said memory to generate the individual pattern waveform.

11. The semiconductor test apparatus as claimed in claim 8, wherein each of the plurality of semiconductor memory devices comprises an interface that inputs a write address and a write data by time-sharing, and said waveform switching unit: individually inputs each of the plurality of individual pattern waveforms into each of the plurality of semiconductor memory devices via the interface at the timing at which the write address should be input into each of the plurality of semiconductor memory devices; and in common inputs the common pattern waveform generated from said first waveform generating means into each of the plurality of semiconductor memory devices via the interface at the timing at which the write data should be input into each of the plurality of semiconductor memory devices.

12. The semiconductor test apparatus as claimed in claim 11, wherein the interface of each of the plurality of semiconductor memory devices inputs a command, the write address, and the write data by time-sharing, and said waveform switching unit:

in common inputs the common pattern waveform generated from said first waveform generating means into each of the plurality of semiconductor memory devices via the interface at the timing at which the command should be input into each of the plurality of semiconductor memory devices;

individually inputs each of the plurality of individual pattern waveforms into each of the plurality of semiconductor memory devices via the interface at the timing at which the write address should be input into each of the plurality of semiconductor memory devices; and in common inputs the common pattern waveform generated from said first waveform generating means into each of the plurality of semiconductor memory devices via the interface at the timing at which the write data should be input into each of the plurality of semiconductor memory devices.

* * * * *